(12) United States Patent  
Sommer

(10) Patent No.: US 8,156,398 B2  
(45) Date of Patent: Apr. 10, 2012

(54) PARAMETER ESTIMATION BASED ON ERROR CORRECTION CODE PARITY CHECK EQUATIONS

(75) Inventor: Naftali Sommer, Rishon Le-Zion (IL)

(73) Assignee: Anobit Technologies Ltd., Herzliya (IL)

( * ) Notice: Subject to any disclaimer, the term of this patent is extended or adjusted under 35 U.S.C. 154(b) by 729 days.

(21) Appl. No.: 12/364,531

(22) Filed: Feb. 3, 2009

(65) Prior Publication Data

US 2009/0199074 A1 Aug. 6, 2009

Related U.S. Application Data

(60) Provisional application No. 61/026,150, filed on Feb. 5, 2008.

(51) Int. Cl.
*H03M 13/00* (2006.01)

(52) U.S. Cl. ............ 714/752; 714/758; 714/763

(58) Field of Classification Search .......... 714/752, 714/758, 763
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,059,564 A | 10/1991 | Mehrotra et al. |
| 5,077,722 A | 12/1991 | Geist et al. |
| 5,126,808 A | 6/1992 | Montalvo et al. |
| 5,163,021 A | 11/1992 | Mehrotra et al. |

(Continued)

FOREIGN PATENT DOCUMENTS

EP 0783754 B1 7/1997

(Continued)

OTHER PUBLICATIONS

U.S. Appl. No. 11/949,135 Official Action dated Oct. 2, 2009.

(Continued)

*Primary Examiner* — Sam Rizk
(74) *Attorney, Agent, or Firm* — D. Kligler IP Services Ltd.

(57) ABSTRACT

A method for operating a memory, which includes analog memory cells, includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

45 Claims, 3 Drawing Sheets

U.S. PATENT DOCUMENTS

| | | | |
|---|---|---|---|
| 5,172,338 A | 12/1992 | Mehrotra et al. |
| 5,182,558 A | 1/1993 | Mayo |
| 5,182,752 A | 1/1993 | Deroo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |

| | | |
|---|---|---|
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nagakawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhesi et al. |
| 7,310,347 B2 | 12/2007 | Lasser |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,483,319 B2 | 1/2009 | Brown |
| 7,487,329 B2 | 2/2009 | Hepkin et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,590,002 B2 | 9/2009 | Mokhlesi et al. |
| 7,593,259 B2 | 9/2009 | Kim et al. |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |

| Patent No. | Date | Inventor |
|---|---|---|
| 7,761,624 B2 | 7/2010 | Karamcheti et al. |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,928,497 B2 | 4/2011 | Yaegashi |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |

| | | | |
|---|---|---|---|
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157950 A1 | 6/2009 | Selinger | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0193184 A1 | 7/2009 | Yu et al. | |
| 2009/0199074 A1 | 8/2009 | Sommer | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0265509 A1 | 10/2009 | Klein | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann et al. | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0082883 A1 | 4/2010 | Chen et al. | |
| 2010/0083247 A1 | 4/2010 | Kanevsky et al. | |
| 2010/0110580 A1 | 5/2010 | Takashima | |
| 2010/0131697 A1 | 5/2010 | Alrod et al. | |
| 2010/0142268 A1 | 6/2010 | Aritome | |
| 2010/0142277 A1 | 6/2010 | Yang et al. | |
| 2010/0169547 A1 | 7/2010 | Ou | |
| 2010/0169743 A1 | 7/2010 | Vogan et al. | |
| 2010/0174847 A1 | 7/2010 | Paley et al. | |
| 2011/0066793 A1 | 3/2011 | Burd | |
| 2011/0075482 A1 | 3/2011 | Shepard et al. | |
| 2011/0107049 A1 | 5/2011 | Kwon et al. | |
| 2011/0199823 A1 | 8/2011 | Bar-Or et al. | |
| 2011/0302354 A1 | 12/2011 | Miller | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed on Jun. 24, 2010.
U.S. Appl. No. 12/880,101 "Reuse of Host Hibernation Storage Space by Memory Controller", filed on Sep. 12, 2010.
U.S. Appl. No. 12/890,724 "Error Correction Coding Over Multiple Memory Pages", filed on Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed 10 Superblock", posted Nov. 11, 2009.
Super User Forums, "SD Card Failure, can't read superblock", posted Aug. 8, 2010.

U.S. Appl. No. 12/987,174 "Redundant Data Storage in Multi-Die Memory Systems", filed on Jan. 10, 2011.
U.S. Appl. No. 12/987,175 "Redundant Data Storage Schemes for Multi-Die Memory Systems" filed on Jan. 10, 2011.
U.S. Appl. No. 12/963,649 "Memory Management Schemes for Non-Volatile Memory Devices" filed on Dec. 9, 2010.
U.S. Appl. No. 13/021,754 "Reducing Peak Current in Memory Systems" filed on Feb. 6, 2011.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn ™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., In "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.

International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
Sommer, N., U.S. Appl. No. 12/171,797 "Memory Device with Non-Uniform Programming Levels" filed on Jul. 11, 2008.
Shalvi et al., U.S. Appl. No. 12/251,471 "Compensation for Voltage Drifts in Analog Memory Cells" filed on Oct. 15, 2008.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
US 7,161,836, 01/2007, Wan et al. (withdrawn)

PARAMETER ESTIMATION BASED ON ERROR CORRECTION CODE PARITY CHECK EQUATIONS

CROSS-REFERENCE TO RELATED APPLICATIONS

This application claims the benefit of U.S. Provisional Patent Application 61/026,150, filed Feb. 5, 2008, whose disclosure is incorporated herein by reference.

FIELD OF THE INVENTION

The present invention relates generally to memory devices, and particularly to methods and systems for adjusting parameters that are used for reading data from analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Data is typically read from a group of memory cells by comparing the storage values of the cells to one or more read thresholds. Various methods and systems for setting the values of read thresholds are known in the art. For example, U.S. Patent Application Publication 2007/0091677, whose disclosure is incorporated herein by reference, describes methods for reading data from one or more Flash memory cells and for recovering from read errors. In some embodiments, in the event of an error correction failure by an error detection and correction module, the Flash memory cells are re-read at least once using one or more modified reference voltages, until successful error correction may be carried out. In some embodiments, after successful error correction, a subsequent read request is handled without re-writing data to the Flash memory cells in the interim U.S. Pat. No. 6,963,505, whose disclosure is incorporated herein by reference, describes methods for determining a reference voltage. In some embodiments, a set of operating reference cells is established to be used in operating cells in a Non-Volatile Memory (NVM) block or array. At least a subset of cells of the NVM block or array may be read using each of two or more sets of test reference cells, where each set of test reference cells may generate or otherwise provide reference voltages at least slightly offset from each other. For each set of test reference cells, a read error rate may be determined. A set of test reference cells associated with a relatively low read error rate may be selected as the set of operating reference cells to be used in operating other cells, outside the subset of cells, in the NVM block or array.

SUMMARY OF THE INVENTION

An embodiment of the present invention provides a method for operating a memory that includes analog memory cells, the method including:

encoding data with an Error Correction Code (ECC), which is representable by a plurality of equations;

storing the encoded data in a group of the analog memory cells by writing respective input storage values to the memory cells in the group;

reading from the memory cells in the group multiple sets of output storage values using one or more different, respective read parameters for each set;

determining respective numbers of the equations that are satisfied by the sets of the output storage values;

identifying a preferred setting of the read parameters responsively to the respective numbers of the satisfied equations; and operating on the memory using the preferred setting of the read parameters.

In some embodiments, the read parameters include read thresholds, and operating on the memory cells includes reading the memory cells using the preferred setting of the read thresholds. Additionally or alternatively, the read parameters include cross-coupling coefficients, and operating on the memory includes canceling cross-coupling interference in the output storage values using the preferred setting of the cross-coupling coefficients. In a disclosed embodiment, the ECC includes a binary ECC and the equations include Boolean equations. In an embodiment, the ECC includes a linear ECC and the equations include parity check equations.

In an embodiment, identifying the preferred setting includes selecting the one or more read parameters that correspond to a set of the output storage values that satisfies a maximum number of the equations. Operating on the memory may include processing a set of the output storage values read using the preferred setting of the read parameters so as to decode the ECC. In some embodiments, a number of the satisfied equations at the preferred setting of the read parameters is less than a total number of the equations in the plurality. In an alternative embodiment, identifying the preferred setting includes selecting the setting of the read parameters at which all of the equations in the plurality are satisfied.

In some embodiments, reading the sets of the output storage values includes attempting to decode the ECC responsively to each of the sets of the output storage values. In an embodiment, identifying the preferred setting includes selecting the setting of the read parameters at which the ECC is decoded successfully. In another embodiment, attempting to decode the ECC includes modifying the sets of the output storage values to produce respective modified sets of the output storage values, and identifying the preferred setting includes selecting the preferred setting responsively to respective modified numbers of the equations that are satisfied by the modified sets of the output storage values. In yet another embodiment, attempting to decode the ECC includes attempting to decode the ECC responsively to a given set of the output storage values only when a number of the equations satisfied by the output storage values in the given set is less than a predefined value.

In a disclosed embodiment, reading the sets of the output storage values includes reading a first set of the output storage values using a given setting of the read parameters, adjusting at least one of the read parameters in a given direction, reading a second set of the output storage values using the adjusted read parameters, making a comparison between a first number of the equations satisfied by the first set of the output storage values and a second number of the equations satisfied by the second set of the output storage values, and, responsively to the comparison, determining whether to reverse the given direction for reading at least one subsequent set of the output storage values.

In another embodiment, reading the output storage values includes determining soft metrics for at least some of the read output storage values, determining the numbers of the satisfied equations includes computing, based on the soft metrics, respective reliability measures of the equations with respect to each of the sets of the output storage values, and identifying the preferred setting of the read parameters includes selecting the preferred setting based on the reliability measures of the equations.

In yet another embodiment, reading the output storage values includes determining Log Likelihood Ratios (LLRs) for at least some of the read output storage values, determining the numbers of the satisfied equations includes substituting respective signs of the LLRs into the equations, and identifying the preferred setting of the read parameters includes selecting the preferred setting based on the numbers of the equations that are satisfied when the signs of the LLRs are substituted therein. In some embodiments, the reading parameters include a time that elapsed since the encoded data was stored in the group of the memory cells and/or a statistical property of a noise that distorts the output storage values.

In some embodiments, the memory cells are included in a memory device, and the preferred setting is identified at a controller that is separate from the memory device. Identifying the preferred setting may include sending from the controller to the memory device a command to apply the preferred setting. In an embodiment, identifying the preferred setting includes sending from the controller to the memory device a notification related to a given set of the output storage values, so as to cause the memory device to read another set of the output storage values. Sending the notification may include indicating to the memory device a failure to decode the ECC based on the given set of the output storage values.

There is additionally provided, in accordance with an embodiment of the present invention, apparatus for operating a memory that includes analog memory cells, the apparatus including:

an Error Correction Code (ECC) module, which is operative to encode data with an ECC, which is representable by a plurality of equations; and circuitry, which is coupled to store the encoded data in a group of the analog memory cells by writing respective input storage values to the memory cells in the group, to read from the memory cells in the group multiple sets of output storage values using one or more different, respective read parameters for each set, to determine respective numbers of the equations that are satisfied by the sets of the output storage values, to identify a preferred setting of the read parameters responsively to the respective numbers of the satisfied equations, and to operate on the memory using the preferred setting of the read parameters.

There is also provided, in accordance with an embodiment of the present invention, apparatus, including:

a memory, including multiple analog memory cells; and circuitry, which is operative to encode data with an Error Correction Code (ECC), which is representable by a plurality of equations, to store the encoded data in a group of the analog memory cells by writing respective input storage values to the memory cells in the group, to read from the memory cells in the group multiple sets of output storage values using one or more different, respective read parameters for each set, to determine respective numbers of the equations that are satisfied by the sets of the output storage values, to identify a preferred setting of the read parameters responsively to the respective numbers of the satisfied equations, and to operate on the memory using the preferred setting of the read parameters.

The present invention will be more fully understood from the following detailed description of the embodiments thereof, taken together with the drawings in which:

DETAILED DESCRIPTION OF EMBODIMENTS

Overview

Figure 1:
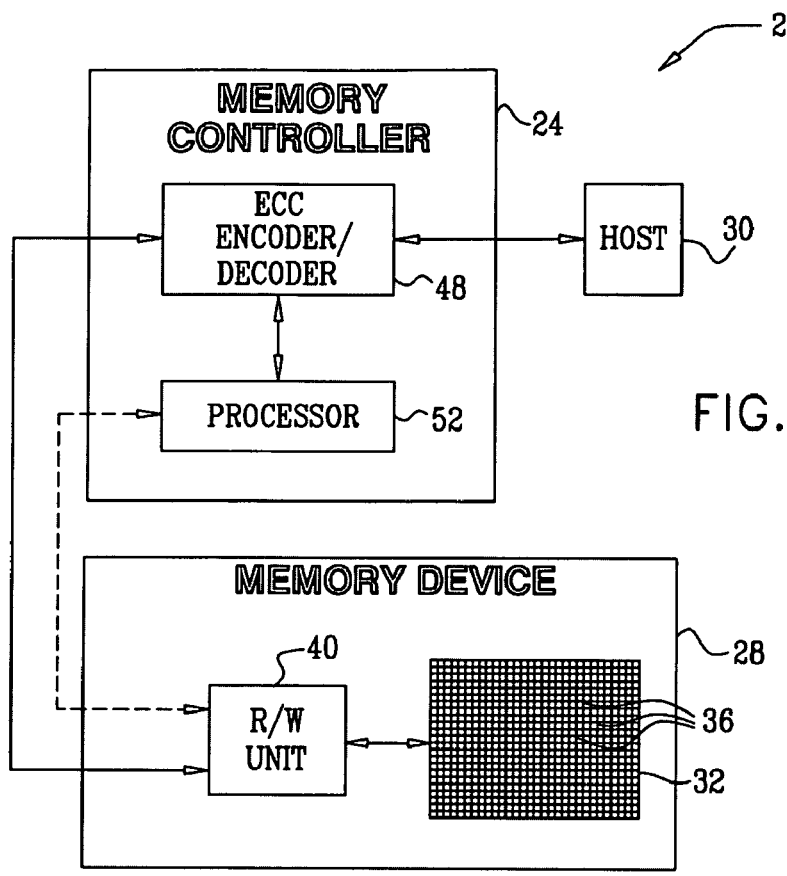
FIG. 1 is a block diagram that schematically illustrates a memory system, in accordance with an embodiment of the present invention.

Analog memory cell devices often read data from the memory cells by setting certain reading parameters, and then reading the memory cells using these parameters. Reading parameters may comprise, for example, read thresholds to which the storage values of the memory cells are compared. Accurate setting of the read threshold values is important for achieving high performance, particularly in Multi-Level Cell (MLC) devices that store multiple bits per cell. The read threshold positions typically have a strong effect on the number of read errors that occur. Other sorts of reading parameters may comprise, for example, cross-coupling coefficients that are used for canceling cross-coupling interference between memory cells.

In many analog memory cell devices, the data stored in the memory cells is encoded with an Error Correction Code (ECC). Typically, a block of k data bits is encoded to produce an ECC code word having n encoded bits, n>k. The encoded bits are then stored in a group of analog memory cells by writing storage values to the cells. The code word is retrieved from memory by comparing the storage values of the analog memory cells in the group to one or more read thresholds. In practice, some of the retrieved bits in the code word may be erroneous due to various impairments. The ECC may or may not be able to correct these errors, depending on the number of erroneous bits in the code word. In many practical cases, the number of erroneous bits per code word depends on the reading parameters used for reading the memory cells. Therefore, it is important to set and maintain the reading parameters at the appropriate values.

Embodiments of the present invention provide improved methods and systems for determining and setting reading parameters (such as read thresholds or cross-coupling coefficients) in analog memory cells that store ECC-encoded data. The disclosed methods and systems use a representation of the ECC as a set of logical equations, such that a vector of n bits is considered a valid code word if and only if it satisfies the entire equation set. When the ECC comprises a linear code, the equations typically comprise parity check equations, i.e., exclusive OR (XOR) operations applied to selected subsets of encoded bits. When a given code word is read from the analog memory cells using a certain set of read thresholds, the methods and systems described herein use the number of the equations that are satisfied by the retrieved code word as a measure of the distance of the reading parameters from their optimal values.

In some embodiments, a given code word is read from the analog memory cells using different settings of the reading parameters. For each setting of the reading parameters being evaluated, the retrieved encoded bits satisfy a certain number of equations. A preferred setting of the reading parameters is identified and used for subsequent operations on the memory cells. Typically, the preferred setting maximizes the number of satisfied Boolean equations. In some embodiments, the preferred setting is determined in an iterative process that adjusts the reading parameters and attempts to gradually increase the number of satisfied equations.

The number of satisfied equations is a sensitive and powerful indication, as opposed to the mere success or failure of ECC decoding. One important benefit of using this indication is that the disclosed methods do not rely on successful decoding of the ECC. The number of satisfied equations can be determined and maximized without ever converging to a valid code word or even reaching a correctable number of erroneous bits. Unlike some known methods that adjust the reading parameters until the ECC is decoded successfully, the methods and systems described herein are able to determine the preferred setting of the reading parameters even if the resulting code word is not decodable at these positions. As such, the disclosed methods and systems are particularly effective in high-distortion conditions.

In some embodiments, full ECC decoding is not attempted for each evaluated setting of the reading parameters. For example, the memory controller may count the number of satisfied equations at each setting being evaluated, and perform full decoding of the ECC code word only at the preferred setting. Refraining from performing full ECC decoding for each setting reduces the time, computational complexity and current consumption of the reading process.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory controller 24, which stores data in a memory device 28 comprising a memory cell array 32. The memory controller and memory device communicate over a suitable interface, such as a bus interface. The memory cell array comprises multiple analog memory cells 36, in which the data is stored. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 36 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 28 comprises a reading/writing (R/W) unit 40, which converts data for storage in the memory device to storage values and writes them into memory cells 36. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 32, R/W unit 40 converts the storage values of memory cells 36 into digital samples having a resolution of one or more bits. Data is typically written to and read from the memory cells in groups that are referred to as pages.

Memory controller 24 comprises an ECC encoder/decoder 48, which encodes the data with an Error Correction Code (ECC) before sending the data to device 28 for storage, and decodes the ECC when retrieving data from device 28. Encoder/decoder 48 may apply any suitable type of ECC. The description that follows sometimes refers separately to an ECC encoder and/or to an ECC decoder, regardless of whether the encoder and decoder are implemented in a single unit or in separate units. The ECC applied by encoder/decoder 48 is represented by a set of logical equations, such as parity check equations. Methods and systems that are described below use these equations to estimate and adjust various reading parameters, such as read thresholds or cross-coupling coefficients, for reading memory cells 36.

The memory controller further comprises a processor 52, which controls the storage and retrieval of data in device 28. In particular, processor 52 controls ECC encoder/decoder 48 and R/W unit 40. Memory controller 24 communicates with a host 30, for accepting data for storage in the memory device and for outputting data retrieved from the memory device. The different elements of controller 24 may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 28 and memory controller 24 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the memory controller's circuitry may reside on the same die on which the memory array is disposed. Further alternatively, some or all of the functionality of the memory controller can be implemented in software and carried out by a processor or other element of the host system. In some implementations, a single memory controller 24 may be connected to multiple memory devices 28. In yet another embodiment, some or all of the memory controller's functionality may be carried out by a separate unit, referred to as a memory extension, which acts as a slave of memory device 28.

Typically, processor 52 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 36 of array 32 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

Using Parity Check Equations for Setting Reading Parameters

Memory controller 24 encodes the data to be stored in memory device 28 with an ECC. In a typical flow, encoder/decoder 48 encodes blocks of k data bits to produce respective ECC code words having n encoded bits each, n>k. The encoded bits are then stored in the analog memory cells of device 28 by writing the appropriate storage values to the cells. Typically although not necessarily, each ECC code word corresponds to a memory page stored in the memory device. When retrieving data from the memory device, the storage values corresponding to a given code word are read from the cells using a certain setting of reading parameters. The description that follows initially addresses read thresholds. Other kinds of reading parameters are addressed further below.

The read storage values correspond to the respective encoded bits of the code word. In practice, however, some of the read storage values may differ from the corresponding written storage values due to various impairments. In other words, some of the encoded bits read from the memory device may be erroneous. Encoder/decoder 48 decodes each ECC code word, so as to reconstruct the data bits. A given ECC usually has a certain correction capability, i.e., a maximum number of erroneous encoded bits per code word that can be corrected by the code. If the number of erroneous encoded bits in a given code word does not exceed the correction capability of the ECC, the code word can be decoded successfully. Otherwise, the decoding operation may fail.

The ECC applied by encoder/decoder 48 is represented by a set of Boolean equations. Each Boolean equation is defined over a subset of the encoded bits in the code word. The encoded bits of a valid code word satisfy all the equations in the set, and vice versa (i.e., if at least one equation in the set is not satisfied, the code word is not valid).

When the ECC comprises a linear ECC, the Boolean equations comprise linear equations that are commonly referred to as parity check equations. Typically, each parity check equation defines an exclusive OR (XOR) operation among a selected subset of the encoded bits in the code word. The equation is satisfied if and only if the XOR result is "0". The parity check equations are commonly arranged in a matrix, which is referred to as a parity check matrix. Parity check matrices are described, for example, by Blahut in "Theory and Practice of Error Control Codes," Addison-Wesley, May, 1984, section 3.2, pages 47-48, which is incorporated herein by reference.

Although the description that follows focuses on linear codes and on parity check equations, the methods and systems described herein are similarly applicable to any other suitable type of ECC and any other suitable type of Boolean equations. A linear ECC that is represented by a set of parity check equations may comprise, for example, a Low Density Parity Check (LDPC) code, a Bose-Chaudhuri-Hocquenghem (BCH) code, a Reed-Solomon (RS) code or a Hamming code. Although the embodiments described herein refer to codes that are represented by sets of Boolean equations, the principles of the present invention can also be used with codes that are defined over non-binary symbols, and which are represented by logical equations that are not necessarily Boolean. For example, a Reed-Solomon code can be defined over 8-bit symbols having 256 possible values. Code words of this code, which comprise multiple 8-bit symbols, satisfy linear equations over a finite field. The methods and systems described herein can also be used with these sorts of codes, e.g., to adjust read thresholds based on the number of non-Boolean logical equations that are satisfied by a given non-binary code word.

As noted above, when the storage values read from memory cells 36 are distorted by various impairments, some of the encoded bits in a given retrieved code word may be erroneous. In such cases, not all of the parity check equations that represent the ECC are satisfied by the code word. Nevertheless, in some cases a certain number of parity check equations may still be satisfied, even though the code word contains erroneous encoded bits. This scenario is especially likely to occur in codes having sparse parity check equations, i.e., equations that are defined over relatively small subsets of the encoded bits. LDPC is a typical example of an ECC having sparse parity check equations.

Figure 4:
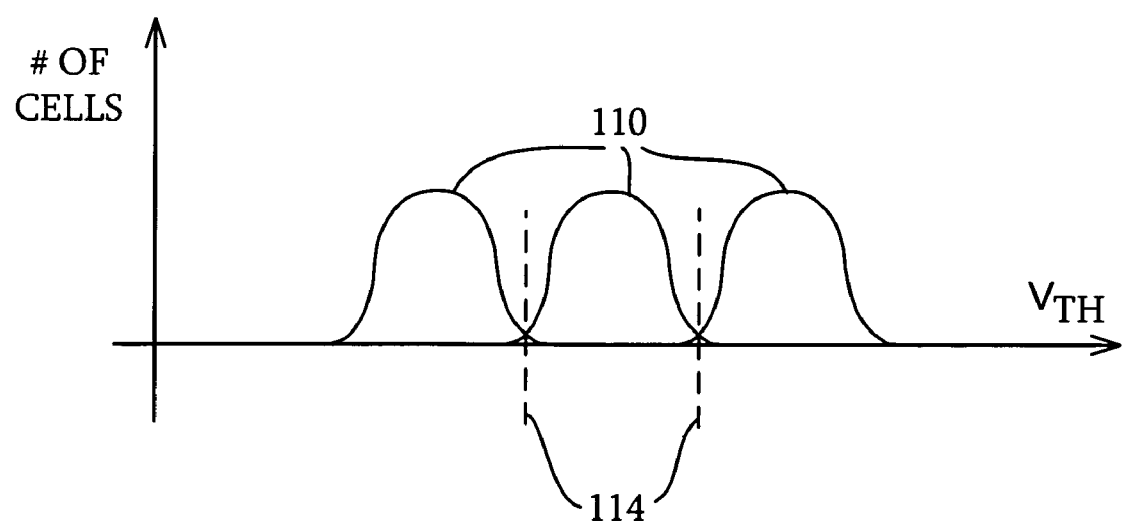
FIG. 4 is a graph showing storage value distributions and read thresholds, in accordance with an embodiment of the present invention.

In some cases, errors in the encoded bits retrieved from memory cells 36 may be caused by non-optimal positioning of the read thresholds that are used to read the cells. An example of read thresholds that are used for reading a group of analog memory cells is shown in FIG. 4 below. It can be shown that the number of parity check equations that are satisfied by a given retrieved code word is often indicative of the distance of the read thresholds used to read the cells from their optimal values. This relationship holds especially for small offsets from the optimal threshold positions, although it may hold to some extent for large deviations, as well.

Some embodiments of the present invention provide methods and systems for adjusting or selecting read threshold values based on counting the number of satisfied parity check equations. Typically, the methods and systems described herein identify preferred threshold positions, which maximize the number of satisfied equations.

Figure 2:
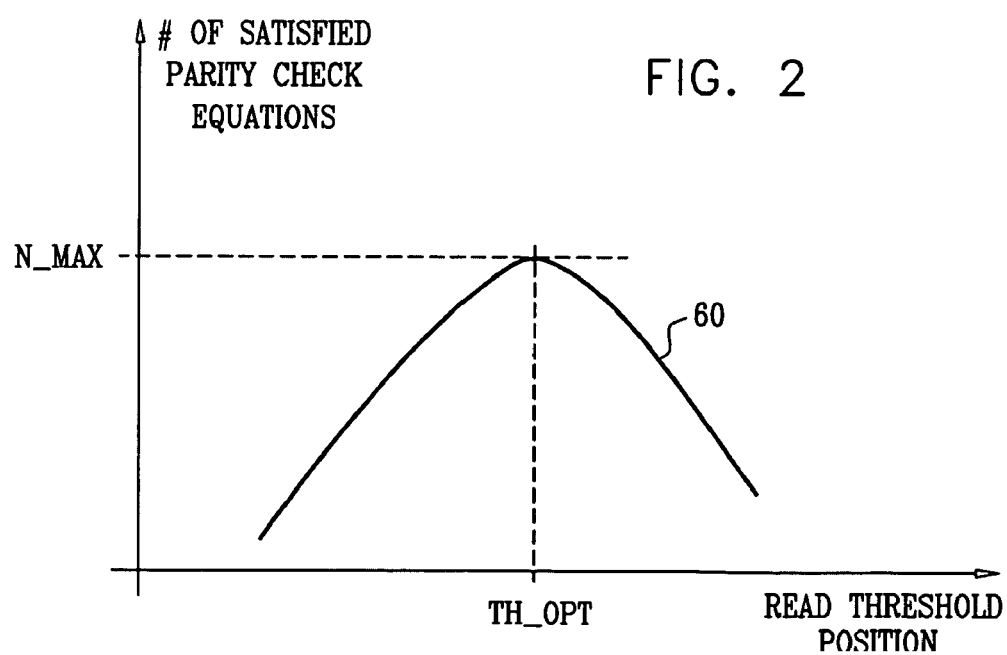
FIG. 2 is a graph showing a dependence of the number of satisfied parity check equations on read threshold position, in accordance with an embodiment of the present invention.

FIG. 2 is a graph showing a dependence of the number of satisfied parity check equations on read threshold position, in accordance with an embodiment of the present invention. The graph of FIG. 2 considers a certain ECC code word that is stored in cells 36, and is read using different read thresholds. For each read threshold position, the retrieved code word will satisfy a certain number of parity check equations. A plot 60 shows the number of satisfied parity check equations as a function of the read threshold position. As can be seen in the figure, the number of satisfied equations reaches a maximum denoted N_MAX when the read threshold is positioned at an optimal value denoted TH_OPT. When the read threshold deviates from its optimal position in either direction, the number of satisfied parity check equations decreases monotonically. This monotonic relationship holds at least within a certain interval around the optimal threshold position.

Note that in some cases N_MAX may still be less than the total number of parity check equations. In other words, the read operation may sometimes produce erroneous encoded bits even if the read threshold position is optimal. Encoder/decoder 48 may or may not be able to correct these errors, depending on whether their number exceeds the correction capability of the ECC. The methods and systems described herein thus enable the memory controller to adjust the read thresholds to their preferred positions even though the code words retrieved using these read thresholds may not be decodable.

The description above referred to the use of a single read threshold, such as being used in 1 bit/cell SLC devices. This choice was made, however, purely for the sake of conceptual clarity. The methods and systems described herein can similarly be used for retrieving data using a set of multiple read thresholds, such as in MLC devices.

Figure 3:
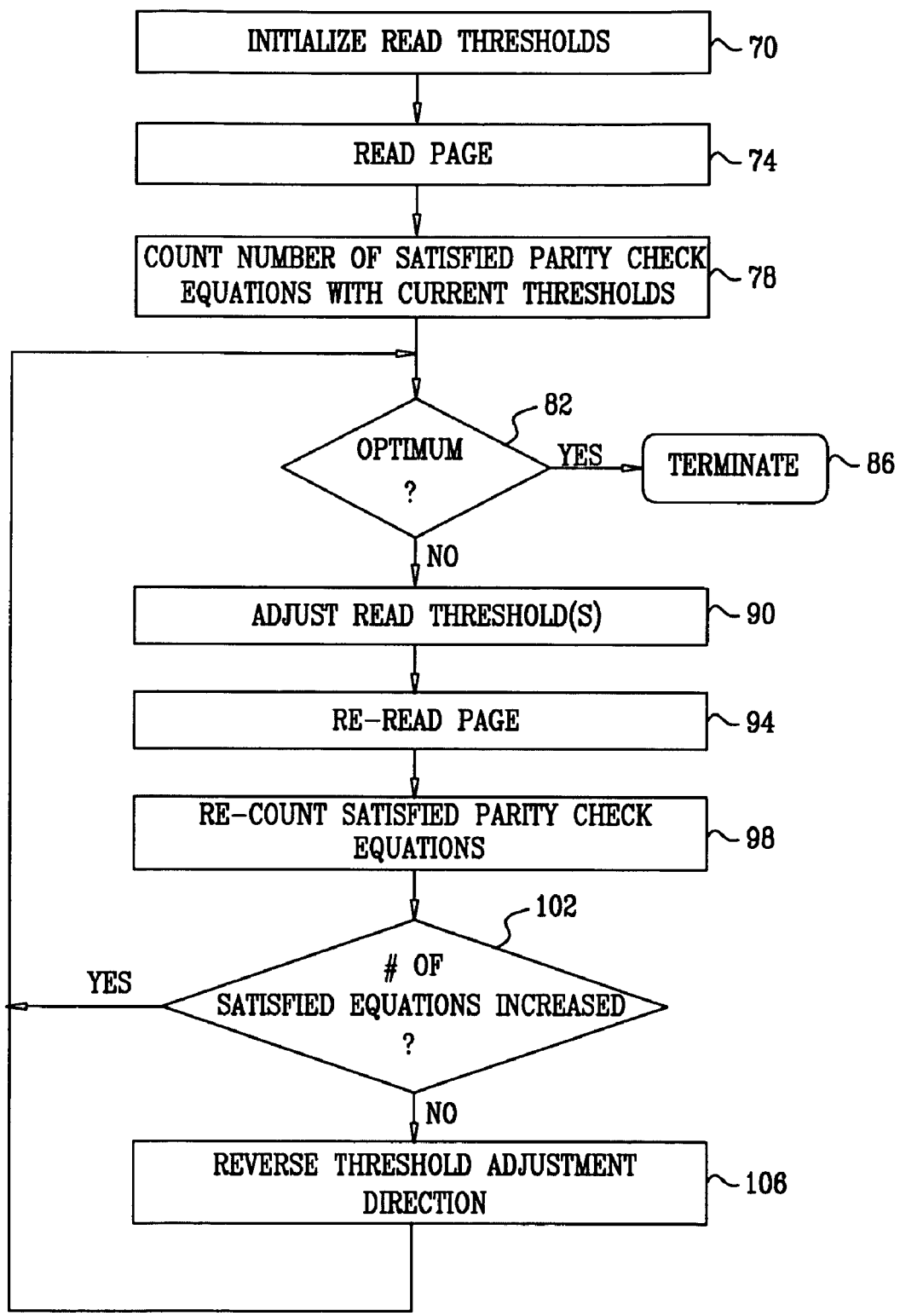
FIG. 3 is a flow chart that schematically illustrates a method for adjusting read thresholds, in accordance with an embodiment of the present invention.

FIG. 3 is a flow chart that schematically illustrates a method for adjusting read thresholds, in accordance with an embodiment of the present invention. The method begins with system 20 initializing the read thresholds that are used for reading data from memory cells 36 to certain initial values, at an initialization step 70. Memory controller 24 reads a memory page from memory device 28, at a reading step 74. In the present example, the page holds the encoded bits of a certain ECC code word that was stored previously. When instructed by processor 52 of the memory controller, R/W unit 40 reads the memory cells using the initial read thresholds.

Processor 52 counts the number of parity check equations that are satisfied by the encoded bits read using the initial read thresholds, at an equation counting step 78. The processor checks whether the number of satisfied equations indicates that the read thresholds are at their preferred values, at a threshold optimum checking step 82. If processor 52 determines that the read thresholds are positioned at the preferred positions, the method terminates, at a termination step 86.

Otherwise, the processor adjusts the read thresholds by a certain increment in a certain direction, at a threshold adjustment step 90. The initial direction of the threshold adjustment may be arbitrary or predefined. Processor 52 then instructs the memory device to re-read the memory page (the code word) using the adjusted read thresholds, at a re-reading step 94. The processor re-counts the number of satisfied parity check equations, at an equation re-counting step 98. The re-counted number of parity check equations corresponds to the adjusted positions of the read thresholds.

Processor 52 now checks whether the number of satisfied parity check equations has increased as a result of the read threshold adjustment, at an increase checking step 102. If the number increased, the processor concludes that the direction in which the read thresholds were adjusted is correct, and the method loops back to step 82 above. The adjustment process continues in the same direction until the read thresholds reach their preferred values.

If, on the other hand, increase checking step 102 shows that the number of satisfied equations has decreased as a result of the read threshold adjustment, processor 52 concludes that the direction in which the read thresholds were adjusted is incorrect. The processor therefore reverses the direction of threshold adjustment, at a direction reversal step 106. The method loops back to step 82 above, and the adjustment process proceeds in the opposite direction. The method terminates at step 86 when the read thresholds converge to the preferred positions, which maximize the number of satisfied parity check equations.

In some embodiments, the adjustment increment from one threshold position to the next (the increment applied at step 90) is constant. In alternative embodiments, the increment may be variable. For example, the increment may depend on the difference in the number of satisfied equations between previous iterations. In other words, if the number of satisfied equations increased considerably in the previous iteration, then the processor may apply a large increment in the next iteration, and vice versa. Alternatively, the increment size may be adapted in accordance with any other suitable logic.

When multiple read thresholds are used (e.g., in MLC devices), the method of FIG. 3 can be applied jointly to all the read thresholds, to a selected subset of the read thresholds, or to each read threshold individually.

In the embodiment of FIG. 3, the read threshold position is adjusted incrementally in order to maximize the number of satisfied equations. In an alternative embodiment, system 20 may use a number (e.g., 4) of predefined sets of read thresholds, which cover the expected range of read threshold positions. Memory controller 24 and/or R/W unit 40 may attempt to read the page with each of the predefined threshold sets, and choose the set corresponding to the largest number of satisfied equations. As in the iterative process of FIG. 3, the system may choose the first attempted set that produces a tolerable number of satisfied equations (e.g., the first set for which ECC decoding is successful) or it may scan all sets and choose the set that maximizes the number of satisfied equations.

In some embodiments, such as in LDPC codes, evaluation of the parity check equations is an integral part of the decoding process performed by encoder/decoder 48 in the memory controller. In such embodiments, the methods and systems described herein can be implemented without incurring additional hardware and the associated cost and size.

In some embodiments, the memory controller decodes the ECC code word at each iteration, i.e., for each evaluated read threshold position, and the method terminates when ECC decoding is successful. The success or failure in decoding the code word can be used as the termination criterion at step 82 above.

In alternative embodiments, the memory controller does not decode the ECC code word for each evaluated read threshold position, but only at step 86, upon reaching the threshold position that maximizes the number of satisfied parity check equations. This technique reduces the computational complexity and power consumption of the threshold adjustment process considerably.

Further alternatively, the memory controller may attempt to decode the ECC code word according to various other conditions, such as when the number of satisfied parity check equations falls below a certain value. In these embodiments, as long as the number of satisfied equations is above a certain number, ECC decoding is not attempted. In other words, the number of satisfied equations can be used to predict, before attempting to decode the code word, whether or not the ECC decoding process is likely to succeed. If the number of satisfied equations is relatively small, then ECC decoding may not be attempted, thus saving time and other resources. If ECC decoding is predicted to fail, other measures can be taken, such as adjusting the read thresholds or re-reading the page.

In some embodiments, the decoding process performed by encoder/decoder 48 comprises an iterative process, which begins with the encoded bits retrieved from cells 36 and attempts to modify them in order to gradually increase the number of satisfied parity check equations. Such iterative decoding processes are used, for example, in LDPC decoders. In these embodiments, the method of FIG. 3 can be applied to the number of satisfied equations at the end of the iterative decoding process.

In other words, encoder/decoder 48 may attempt to decode the ECC code word for each evaluated read threshold position using the iterative decoding process. For each evaluated read threshold position, processor 52 may count the number of parity check equations that are satisfied at the end of the iterative decoding process. The read threshold position at which this number of satisfied equations is maximized is regarded as the optimum position, irrespective of whether the code word is decoded successfully or not.

Moreover, the methods described herein can be applied to the number of satisfied equations following the decoding process, whether or not the decoding process is iterative or not. In other words, encoder/decoder 48 may attempt to decode the ECC for each evaluated threshold position using any suitable ECC decoding process. These attempts will generally reduce the number of erroneous bits, although ECC decoding may not always succeed. Processor 52 may select the appropriate read threshold position based on the number of satisfied parity check equations after ECC decoding.

In some embodiments, the threshold setting methods described herein can be combined with other threshold setting processes, so as to adjust the read thresholds based on the number of satisfied parity check equations and on other criteria. Some threshold setting methods that can be used for this purpose are described, for example, in PCT International Publications WO/2008/053472 and WO/2008/111058, whose disclosures are incorporated herein by reference. Combining multiple threshold setting criteria may provide higher accuracy and/or a smaller number of iterations.

In some embodiments, encoder/decoder 48 receives soft metrics that correspond to the encoded bits, and uses these metrics in decoding the code word. The soft metric of a given encoded bit is typically indicative of the confidence level associated with this bit, or the likelihood of this bit to be erroneous. Soft metrics may comprise, for example, Log Likelihood Ratios (LLRs) of the encoded bits. In these embodiments, each parity check equation may be assigned a reliability measure, which depends on the soft metrics of the encoded bits that appear in the equation. The reliability measure of a given equation is indicative of the likelihood that this equation is satisfied.

The method of FIG. 3 can be used to find the read threshold position that maximizes the sum of soft reliability measures over the different parity check equations. In other words, for each evaluated read threshold position, processor 52 computes the sum of the soft reliability measures of the different parity check equations. The read threshold position at which the cumulative reliability measure is maximized is regarded as the optimum position.

When using LLRs, the sign of an LLR of a given bit can be used as an interim hard decision. In some embodiments, processor 52 may substitute the signs of the LLRs of the encoded bits into the parity check equations, and count the number of satisfied equations by the LLR signs.

In the description above, the preferred read thresholds determined for a given group of memory cells are used for reading data from the same group of cells. In alternative embodiments, however, the preferred read thresholds can be used for reading data from a different group of memory cells, such as cells in a different word line or block.

FIG. 4 is a graph showing storage value distributions and read thresholds, in accordance with an embodiment of the present invention. The example of FIG. 4 shows three storage value distributions 110, which correspond to three programming levels. Each programming level represents a data value stored in the memory cells. In order to read the data stored in the memory cells, read thresholds 114 are positioned between adjacent distributions. If the read thresholds are positioned properly, the probability of a read storage value falling on the wrong side of a threshold (and thus causing a read error) is small. Note that in the example of FIG. 4, adjacent distributions have a certain overlap. In such cases, some read errors will occur. Assuming the number of read errors is sufficiently small, the errors can be corrected by the ECC.

Alternative Reading Parameters

The description above focused on the setting of read thresholds based on the number of satisfied Boolean equations. In alternative embodiments, the methods and systems described herein can be used to adjust or set various other sorts of parameters that are related to reading data from memory cells 36.

For example, the memory controller may adjust cross-coupling coefficients, which are used for canceling cross-coupling interference in the storage values read from memory cells 36, based on the number of satisfied parity check equations. In some cases the storage values stored in memory cells 36 are distorted by cross-coupling interference from other memory cells. In some embodiments, memory controller 24 applies an interference cancellation process for canceling the cross-coupling interference in the storage values read from memory cells 36. The memory controller may use any suitable interference cancellation method. Several examples of interference cancellation methods are described in PCT International Publications WO 2007/132453, WO 2007/132457 and WO 2008/026203, whose disclosures are incorporated herein by reference.

In some cross-coupling cancellation methods, the memory controller estimates the cross-coupling coefficients, i.e., the coupling ratios between memory cells, and then estimates and cancels the interference in a given cell based on the storage values of the other cells and on the estimated cross-coupling coefficients. As can be appreciated, accurate estimation of the cross-coupling coefficients is important for effectively cancelling the cross-coupling interference.

In particular, when the memory controller applies interference cancellation to a certain read code word prior to ECC decoding, the number of satisfied parity check equations may depend on the accuracy of the cross-coupling coefficients used in the cancellation process. Thus, the number of satisfied equations can be used as an indication of the accuracy of the cross-coupling coefficient. In some embodiments, the memory controller applies a process, similar to the method of FIG. 3 above, for adjusting the cross-coupling coefficient values based on the number of satisfied equations. Typically, the process attempts to find the cross-coupling coefficient values that maximize the number of satisfied equations.

In some embodiments, the memory controller adjusts certain reading parameters that are related to the positions of the read thresholds, rather than adjusting the read thresholds directly. For example, when multiple read thresholds are used, the optimal position of each read threshold may shift over time in accordance with a certain known behavior. Different read thresholds may exhibit different shifts as a function of time. In such cases, the memory controller may regard the time that elapsed since the memory cells were programmed as a reading parameter, and track its value based on the number of satisfied parity check equations. Once the elapsed time period is estimated, the different read thresholds can be positioned accordingly.

Yet another example of reading parameters that can be estimated based on the parity check equations involves estimating the statistical properties of noise that distorts the encoded bits read from the memory. When the noise can be assumed or approximated to be Gaussian, the estimated statistical property may comprise a variance or standard deviation of the noise. Estimates of the noise standard deviation is used, for example, as part of the LLR calculation in soft decoding of LDPC codes, as well as other types of ECC. In some embodiments, processor 52 can estimate the Gaussian noise standard deviation by counting the number of unsatisfied equations. When the code word is read using the optimal read threshold positions, the number of unsatisfied equations is indicative of the noise amplitude. In some embodiments, the processor may hold a predefined look-up table that provides the noise variance (or standard deviation) as a function of the number of unsatisfied equations. During operation, the number of unsatisfied equations can be counted, and the noise standard deviation can be estimated by querying the lookup table. Alternatively, the processor may estimate any other suitable statistical property of the noise that distorts the read encoded bits based on the number of satisfied equations.

In some embodiments, the memory controller and the memory device support a command interface, which comprises at least one command for carrying out the parameter setting (e.g., threshold adjustment) processes described herein. For example, the command interface may comprise a command from the memory controller to the memory device, instructing the memory device to shift one or more read thresholds (or other reading parameters) or to set their values. As another example, the interface may comprise a command in which the memory controller reports to the memory device that ECC decoding has failed, or that the number of satisfied equations is not yet high enough. In response to such a command, the memory device may shift one or more read thresholds and re-read the code word.

Although the embodiments described herein mainly address data storage applications, the principles of the present invention can also be used in communication systems. For example, a communication receiver may receive a modulated signal, which carries ECC code words. The signal may be modulated using any suitable modulation, such as Pulse Amplitude Modulation (PAM) or Quadrature Amplitude Modulation (QAM). The receiver may receive the signal using a certain adaptive loop, such as a carrier recovery (phase recovery) loop, a timing recovery loop or an Automatic Frequency Control (AFC) loop. The receiver may receive a given code word, count the number of satisfied parity check equations, and adapt the loop using feedback that is derived from the number of satisfied equations.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes analog memory cells, the method comprising:
    encoding data with an Error Correction Code (ECC), which is representable by a plurality of equations;
    storing the encoded data in a group of the analog memory cells by writing respective input storage values to the memory cells in the group;
    reading from the memory cells in the group multiple sets of output storage values using one or more different, respective read parameters for each set;
    determining respective numbers of the equations that are satisfied by the sets of the output storage values;
    identifying a preferred setting of the read parameters responsively to the respective numbers of the satisfied equations; and
    operating on the memory using the preferred setting of the read parameters.

2. The method according to claim 1, wherein the read parameters comprise read thresholds, and wherein operating on the memory cells comprises reading the memory cells using the preferred setting of the read thresholds.

3. The method according to claim 1, wherein the read parameters comprise cross-coupling coefficients, and wherein operating on the memory comprises canceling cross-coupling interference in the output storage values using the preferred setting of the cross-coupling coefficients.

4. The method according to claim 1, wherein the ECC comprises a binary ECC, and wherein the equations comprise Boolean equations.

5. The method according to claim 1, wherein the ECC comprises a linear ECC, and wherein the equations comprise parity check equations.

6. The method according to claim 1, wherein identifying the preferred setting comprises selecting the one or more read parameters that correspond to a set of the output storage values that satisfies a maximum number of the equations.

7. The method according to claim 1, wherein operating on the memory comprises processing a set of the output storage values read using the preferred setting of the read parameters so as to decode the ECC.

8. The method according to claim 1, wherein a number of the satisfied equations at the preferred setting of the read parameters is less than a total number of the equations in the plurality.

9. The method according to claim 1, wherein identifying the preferred setting comprises selecting the setting of the read parameters at which all of the equations in the plurality are satisfied.

10. The method according to claim 1, wherein reading the sets of the output storage values comprises attempting to decode the ECC responsively to each of the sets of the output storage values.

11. The method according to claim 10, wherein identifying the preferred setting comprises selecting the setting of the read parameters at which the ECC is decoded successfully.

12. The method according to claim 10, wherein attempting to decode the ECC comprises modifying the sets of the output storage values to produce respective modified sets of the output storage values, and wherein identifying the preferred setting comprises selecting the preferred setting responsively to respective modified numbers of the equations that are satisfied by the modified sets of the output storage values.

13. The method according to claim 10, wherein attempting to decode the ECC comprises attempting to decode the ECC responsively to a given set of the output storage values only when a number of the equations satisfied by the output storage values in the given set is less than a predefined value.

14. The method according to claim 1, wherein reading the sets of the output storage values comprises:
    reading a first set of the output storage values using a given setting of the read parameters;
    adjusting at least one of the read parameters in a given direction;
    reading a second set of the output storage values using the adjusted read parameters;
    making a comparison between a first number of the equations satisfied by the first set of the output storage values and a second number of the equations satisfied by the second set of the output storage values; and
    responsively to the comparison, determining whether to reverse the given direction for reading at least one subsequent set of the output storage values.

15. The method according to claim 1, wherein reading the output storage values comprises determining soft metrics for at least some of the read output storage values, wherein determining the numbers of the satisfied equations comprises computing, based on the soft metrics, respective reliability measures of the equations with respect to each of the sets of the output storage values, and wherein identifying the preferred setting of the read parameters comprises selecting the preferred setting based on the reliability measures of the equations.

16. The method according to claim 1, wherein reading the output storage values comprises determining Log Likelihood Ratios (LLRs) for at least some of the read output storage values, wherein determining the numbers of the satisfied equations comprises substituting respective signs of the LLRs into the equations, and wherein identifying the preferred setting of the read parameters comprises selecting the preferred setting based on the numbers of the equations that are satisfied when the signs of the LLRs are substituted therein.

17. The method according to claim 1, wherein the reading parameters comprise a time that elapsed since the encoded data was stored in the group of the memory cells.

18. The method according to claim 1, wherein the reading parameters comprise a statistical property of a noise that distorts the output storage values.

19. The method according to claim 1, wherein the memory cells are comprised in a memory device, and wherein the preferred setting is identified at a controller that is separate from the memory device.

20. The method according to claim 19, wherein identifying the preferred setting comprises sending from the controller to the memory device a command to apply the preferred setting.

21. The method according to claim 19, wherein identifying the preferred setting comprises sending from the controller to the memory device a notification related to a given set of the output storage values, so as to cause the memory device to read another set of the output storage values.

22. The method according to claim 21, wherein sending the notification comprises indicating to the memory device a failure to decode the ECC based on the given set of the output storage values.

23. Apparatus for operating a memory that includes analog memory cells, the apparatus comprising:
    an Error Correction Code (ECC) module, which is operative to encode data with an ECC, which is representable by a plurality of equations; and
    circuitry, which is coupled to store the encoded data in a group of the analog memory cells by writing respective input storage values to the memory cells in the group, to read from the memory cells in the group multiple sets of output storage values using one or more different, respective read parameters for each set, to determine respective numbers of the equations that are satisfied by the sets of the output storage values, to identify a preferred setting of the read parameters responsively to the respective numbers of the satisfied equations, and to operate on the memory using the preferred setting of the read parameters.

24. The apparatus according to claim 23, wherein the read parameters comprise read thresholds, and wherein the circuitry is coupled to read the memory cells using the preferred setting of the read thresholds.

25. The apparatus according to claim 23, wherein the read parameters comprise cross-coupling coefficients, and wherein the circuitry is coupled to cancel cross-coupling interference in the output storage values using the preferred setting of the cross-coupling coefficients.

26. The apparatus according to claim 23, wherein the ECC comprises a binary ECC, and wherein the equations comprise Boolean equations.

27. The apparatus according to claim 23, wherein the ECC comprises a linear ECC, and wherein the equations comprise parity check equations.

28. The apparatus according to claim 23, wherein the circuitry is coupled to select the one or more read parameters that correspond to a set of the output storage values that satisfies a maximum number of the equations.

29. The apparatus according to claim 23, wherein the circuitry is coupled to process a set of the output storage values read using the preferred setting of the read parameters so as to decode the ECC.

30. The apparatus according to claim 23, wherein a number of the satisfied equations at the preferred setting of the read parameters is less than a total number of the equations in the plurality.

31. The apparatus according to claim 23, wherein the circuitry is coupled to identify the preferred setting by selecting the setting of the read parameters at which all of the equations in the plurality are satisfied.

32. The apparatus according to claim 23, wherein the circuitry is coupled to cause the ECC module to attempt decoding the ECC responsively to each of the sets of the output storage values.

33. The apparatus according to claim 32, wherein the circuitry is coupled to identify the preferred setting by selecting the setting of the read parameters at which the ECC is decoded successfully.

34. The apparatus according to claim 32, wherein the ECC module is operative to attempt decoding the ECC by modifying the sets of the output storage values to produce respective modified sets of the output storage values, and wherein the circuitry is coupled to select the preferred setting responsively to respective modified numbers of the equations that are satisfied by the modified sets of the output storage values.

35. The apparatus according to claim 32, wherein the circuitry is coupled to cause the ECC module to attempt decoding the ECC responsively to a given set of the output storage values only when a number of the equations satisfied by the output storage values in the given set is less than a predefined value.

36. The apparatus according to claim 23, wherein the circuitry is coupled to read a first set of the output storage values using a given setting of the read parameters, to adjust at least one of the read parameters in a given direction, to read a second set of the output storage values using the adjusted read parameters, to make a comparison between a first number of the equations satisfied by the first set of the output storage values and a second number of the equations satisfied by the second set of the output storage values, and, responsively to the comparison, to determine whether to reverse the given direction for reading at least one subsequent set of the output storage values.

37. The apparatus according to claim 23, wherein the circuitry is coupled to determine soft metrics for at least some of the read output storage values, to compute, based on the soft metrics, respective reliability measures of the equations with respect to each of the sets of the output storage values, and to select the preferred setting based on the reliability measures of the equations.

38. The apparatus according to claim 23, wherein the circuitry is coupled determine Log Likelihood Ratios (LLRs) for at least some of the read output storage values, to substitute respective signs of the LLRs into the equations, and to and to select the preferred setting based on the numbers of the equations that are satisfied when the signs of the LLRs are substituted therein.

39. The apparatus according to claim 23, wherein the reading parameters comprise a time that elapsed since the encoded data was stored in the group of the memory cells.

40. The apparatus according to claim 23, wherein the reading parameters comprise a statistical property of a noise that distorts the output storage values.

41. The apparatus according to claim 23, wherein the memory cells are comprised in a memory device, and wherein the circuitry comprises:
first circuitry, which is comprised in the memory device and is operative to read the output storage values; and
second circuitry, which is separate from the memory device and is coupled to communicate with the first circuitry over an interface and to identify the preferred setting.

42. The apparatus according to claim 41, wherein the second circuitry is coupled to send over the interface to the first circuitry a command to apply the preferred setting.

43. The apparatus according to claim 41, wherein the second circuitry is coupled to send over the interface to the first circuitry a notification related to a given set of the output storage values, so as to cause the first circuitry to read another set of the output storage values.

44. The apparatus according to claim 43, wherein the second circuitry comprises the ECC module, and wherein the notification comprises an indication of a failure of the ECC module to decode the ECC based on the given set of the output storage values.

45. Apparatus, comprising:
a memory, comprising multiple analog memory cells; and
circuitry, which is operative to encode data with an Error Correction Code (ECC), which is representable by a plurality of equations, to store the encoded data in a group of the analog memory cells by writing respective input storage values to the memory cells in the group, to read from the memory cells in the group multiple sets of output storage values using one or more different, respective read parameters for each set, to determine respective numbers of the equations that are satisfied by the sets of the output storage values, to identify a preferred setting of the read parameters responsively to the respective numbers of the satisfied equations, and to operate on the memory using the preferred setting of the read parameters.

* * * * *